United States Patent
Abagnale et al.

(10) Patent No.: US 7,888,256 B2
(45) Date of Patent: Feb. 15, 2011

(54) PROCESS FOR FORMING AN INTERFACE BETWEEN SILICON CARBIDE AND SILICON OXIDE WITH LOW DENSITY OF STATES

(75) Inventors: Giovanni Abagnale, Catania (IT); Dario Salinas, Catania (IT); Sebastiano Ravesi, Sant'Agata Li Battiati (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 303 days.

(21) Appl. No.: 12/069,198

(22) Filed: Feb. 8, 2008

(65) Prior Publication Data

US 2008/0191217 A1      Aug. 14, 2008

(30) Foreign Application Priority Data

Feb. 9, 2007    (IT)    ............ TO2007A0099

(51) Int. Cl.
*H01L 21/28* (2006.01)
*H01L 21/3205* (2006.01)
(52) U.S. Cl. .............. 438/603; 257/E21.054; 257/E21.055; 257/E21.065; 438/93; 438/285; 438/931
(58) Field of Classification Search ........ 257/E21.054, 257/E21.055, E21.065; 438/93, 285, 603, 438/931
See application file for complete search history.

(56) References Cited

U.S. PATENT DOCUMENTS

| 6,686,616 B1 * | 2/2004 | Allen et al. ........... 257/280 |
| 6,734,461 B1 * | 5/2004 | Shiomi et al. .......... 257/77 |
| 7,022,378 B2 | 4/2006 | Das et al. |

OTHER PUBLICATIONS

Florin Clobanu; Gerhard Pensi; Valeri Afanasev & Adolf Schoner, "Low Density of Interface States in n-type 4H-SiC Mos Capacitors Achieved by Nitrogen Implantation," Materials Science Forum Vols. 483-485 pp. 693-696 (2005).

* cited by examiner

*Primary Examiner*—Asok K Sarkar
(74) *Attorney, Agent, or Firm*—Lisa K. Jorgenson; Kevin D. Jablonski; Graybeal Jackson LLP

(57) ABSTRACT

An embodiment of a process for forming an interface between a silicon carbide (SiC) layer and a silicon oxide ($SiO_2$) layer of a structure designed to conduct current is disclosed. A first epitaxial layer having a first doping level is homo-epitaxially grown on a substrate. The homo-epitaxial growth is preceded by growing, on the first epitaxial layer, a second epitaxial layer having a second doping level higher than the first doping level. Finally, the second epitaxial layer is oxidized so as to be totally removed. Thereby, a silicon oxide layer of high quality is formed, and the interface between the second epitaxial layer and silicon oxide has a low trap density.

29 Claims, 3 Drawing Sheets

US 7,888,256 B2

PROCESS FOR FORMING AN INTERFACE BETWEEN SILICON CARBIDE AND SILICON OXIDE WITH LOW DENSITY OF STATES

CLAIM OF PRIORITY

This application claims priority from Italian patent application No. TO2007A000099, filed on Feb. 9, 2007, which is incorporated herein by reference.

TECHNICAL FIELD

An embodiment of the present invention relates to a process for forming an interface between silicon carbide (SiC) and silicon oxide ($SiO_2$). More specifically, an embodiment of the invention relates to a process for forming an interface between a layer of silicon carbide (SiC) and a layer of silicon oxide ($SiO_2$) with low density of the interface states. In particular, the process may used in the manufacture of a structure designed to conduct current, such as a MOS device, an IGBT, or a bipolar device. The following description refers to the manufacture of a MOS device with the only purpose of simplifying exposition thereof.

BACKGROUND

In the development of MOS devices, a considerable interest has been directed to the use of silicon carbide (SiC). According to well-known processes, MOS devices based upon the use of SiC, such as, for example, the device of FIG. 1, are obtained by providing a substrate 10, of doped SiC, e.g., of N+ type; growing an epitaxial layer 11, of doped SiC, e.g. of N− type; depositing, on the epitaxial layer 11, an insulation layer (oxide gate 12); and forming a gate region 13, and source 14 and drain 15 regions, according to processes known in the art.

A current problem in the development of devices that use SiC is that the gate-oxide layer 12 is exposed to higher temperatures and electrical fields than in applications where silicon MOS devices are used. Consequently, it is necessary to evaluate the reliability of silicon oxide ($SiO_2$) for large thicknesses of oxide.

Another problem is the poor electrical quality of the SiC/$SiO_2$ interface, which is due mainly to the defects at the interface. In fact, the typical density of undesired energy states, caused by the presence of defects, at the SiC/$SiO_2$ interface is greater, by various orders of magnitude, than at the Si/$SiO_2$ interface. Recent studies have demonstrated that this phenomenon is due to the accumulation, during the growth of the thermal oxide of the device, of excess carbon atoms at the interface. These carbon atoms create trap states, i.e., localized areas that can attract free electric carriers. The traps can be caused by electrochemical bonds at the interface between different materials, such as $SiO_2$ and SiC. In fact, the carbon is in the form of graphite and/or of agglomerates of sp2 orbitals, referred to as "bonded clusters", and has energy levels distributed in the entire band of the SiC. The trap states create, then, undesired energy states, which can spoil the properties of the materials close to the interface and can reduce the performance of the respective devices. The traps can also cause an interruption of the field lines and Coulomb scattering, thus jeopardizing electrical operation of the device.

It is known that these trap states are stable to the processes of passivation in $H_2$. For this reason, a known solution for improving the quality of the oxide and of the SiC/$SiO_2$ interface envisages the use of processes of oxinitridation, i.e., oxidation in an environment rich in nitrogen, which cause the removal of the carbon atoms and the passivation of the free bonds of silicon. In fact, on the one hand, nitrogen creates strong bonds Si≡N with silicon, which passivate the traps at the interface; on the other hand, the nitrogen, by forming bonds N—C with carbon, removes the carbon and other compounds, such as Si—CO, from the SiC/$SiO_2$ interface. In particular, oxinitridation obtained using NO or $N_2O$ has proven effective in reducing the states density at the interface close to the conduction band of SiC. On the other hand, even though annealing in $N_2O$ and NO furnishes nitrogen for passivating the traps, apparently it does not eliminate completely the problem of the presence of oxygen at the interface.

A solution to this problem is described in U.S. Pat. No. 7,022,378, which is incorporated herein by reference, wherein, after growing a $SiO_2$ layer on a SiC substrate in an $N_2O$ and/or NO environment, an annealing is performed using $NH_3$ as gas. Since this annealing gas does not contain oxygen, the oxide layer does not continue to grow during the nitridation process.

However, the use of a gas such as NO and/or $N_2O$ and $NH_3$ for passivating the excess energy states involves considerable problems. In fact, since NO and $NH_3$ are highly inflammable, it is not advisable to use this type of gas in traditional ovens. Instead, the use of $N_2O$ during the thermal processes brings about a lower efficiency in the passivation of the states at the interface.

A technique used for preventing the problem of the high density of energy states at the SiC/$SiO_2$ interface without using gas as NO, $N_2O$ and $NH_3$ is that of implanting nitrogen atoms N in the SiC layer and hence performing an oxidation. A technique of this kind is described in the article "Low Density of Interface States in n-type 4H—SiC MOS Capacitors Achieved by Nitrogen Implantation", published in Materials Science Forum Vols. 483-485 (2005) pp. 693-696, which is incorporated herein by reference.

However, the implantation of N leads to considerable damage to the SiC surface and involves the introduction, in the process, of an additional diffusion step, useful for activating the implanted nitrogen. Furthermore, the step of diffusion is performed at temperatures higher than 1400° C., a situation that could create a further damage to the SiC.

Consequently, it is desirable to identify new strategies for overcoming the problems of the known art and improving the quality of the SiC/$SiO_2$ interface, avoiding the use of processes of annealing in nitrogen and processes of implantation of nitrogen, and reducing to the minimum the defectiveness in the device.

SUMMARY

An embodiment of the present invention is a process for forming a SiC/$SiO_2$ interface of the type that overcomes one or more of the problems with prior interfaces.

BRIEF DESCRIPTION OF THE DRAWINGS

To facilitate an understanding, one or more embodiments of the present invention are now described, purely by way of non-limiting example, with reference to the attached drawings, wherein.

DETAILED DESCRIPTION

Figure 1:
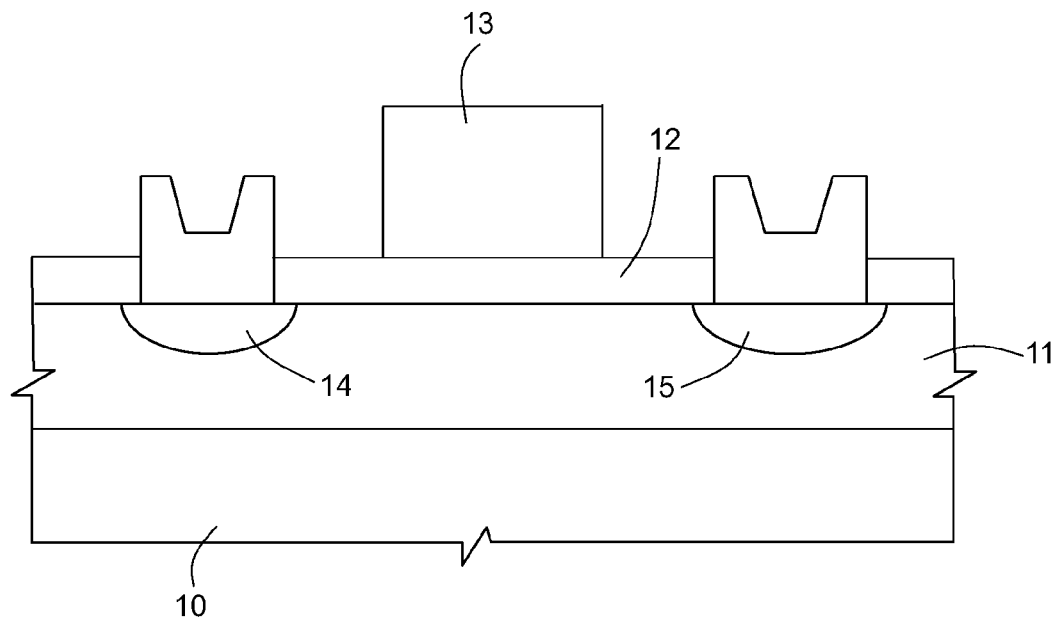
FIG. 1 shows the cross-section through a semiconductor wafer of a MOS device based upon SiC, according to the prior art.
Figure 2:
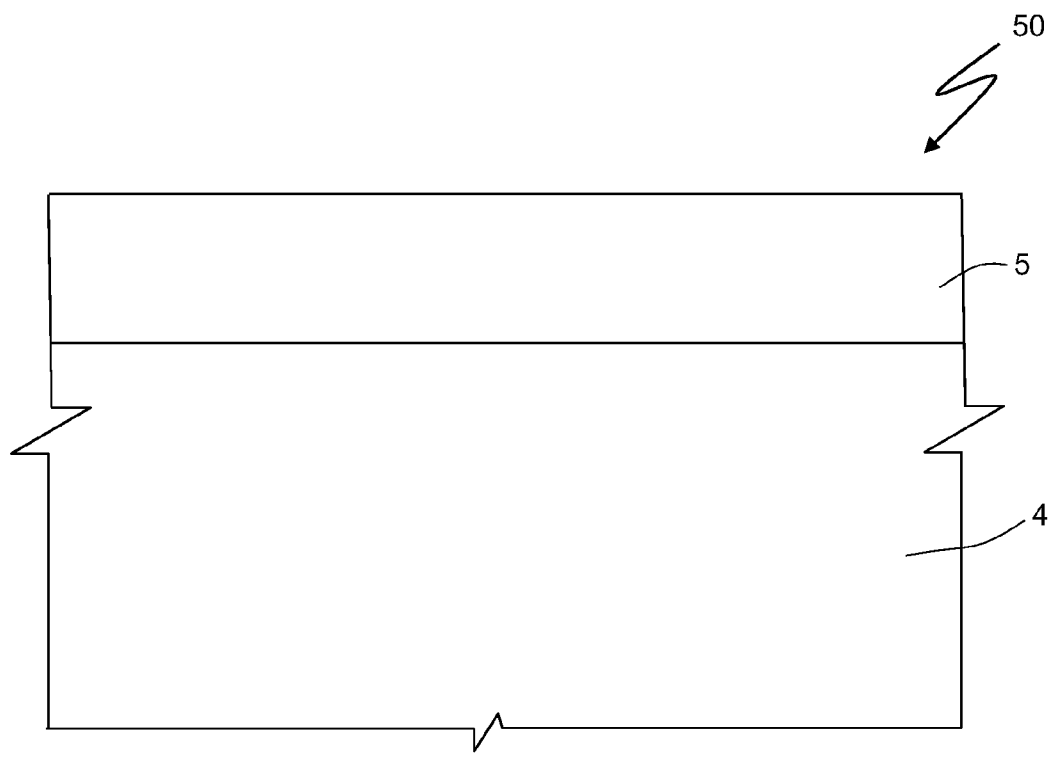
FIG. 2-5 show cross-sections through a silicon carbide wafer in successive manufacturing steps of a structure designed to conduct current of a MOS type according to one or more embodiments of the present invention.

FIGS. 2-5 are cross-sectional views illustrating stages in a method of fabricating a semiconductor structure according to one or more embodiments of the present invention. FIG. 2, shows a wafer 50 of silicon carbide (SiC) that comprises a substrate 4, and a buffer layer 5 of silicon carbide, both doped, for example of N+ type, with a doping higher than or equal to $1 \times 10^{18}$ atoms/cm$^3$. In one embodiment, the doping level may range from $2 \times 10^{18}$-$5 \times 10^{19}$ atoms/cm$^3$. The buffer layer 5 is grown homo-epitaxially above the substrate 4. The homo-epitaxial growth consists in growing layers of a material on a crystal with a single crystallographic orientation along a predefined axis. The crystals thus grown lie on a perpendicular plane to the predefined axis and grow only along the principal crystallographic axis (generally identified according to the Miller rules). In this way, layers the grown layers are monocrystalline, i.e., reproduce only the crystallographic orientation of the starting crystal and its symmetry. To obtain homo-epitaxial growth, CVD (Chemical Vapor Deposition) technique is usually adopted, and the epitaxial process must be controlled so as to thermodynamically favor the formation of one crystal rather than another.

Figure 3:
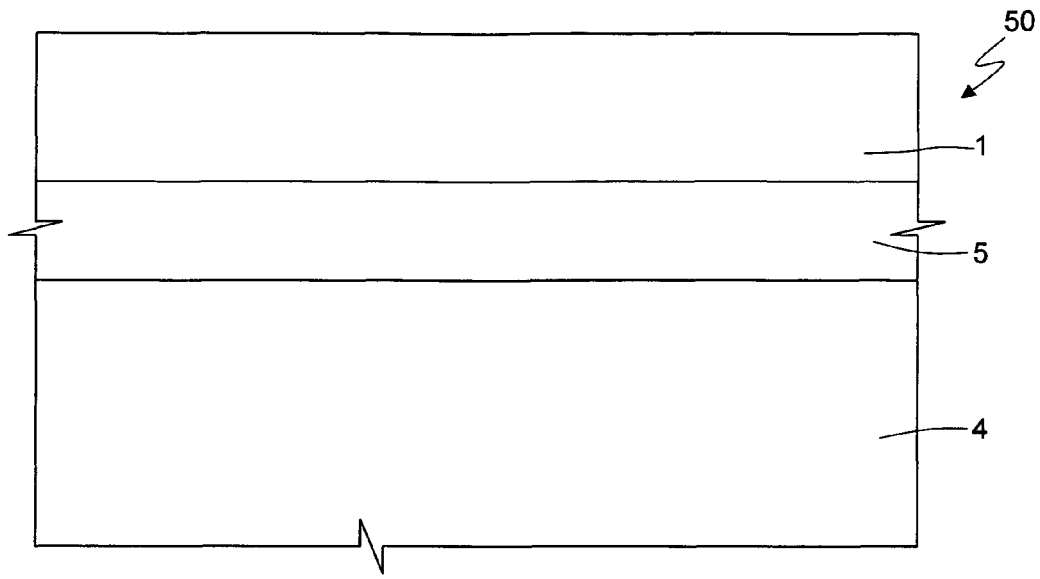

As is illustrated in FIG. 3, a first epitaxial layer 1 is homo-epitaxially grown on top of the buffer layer 5. The first epitaxial layer 1 is also formed of doped silicon carbide, for example of N type, with a lower doping level than the substrate 4 and the buffer layer 5.

Figure 4:
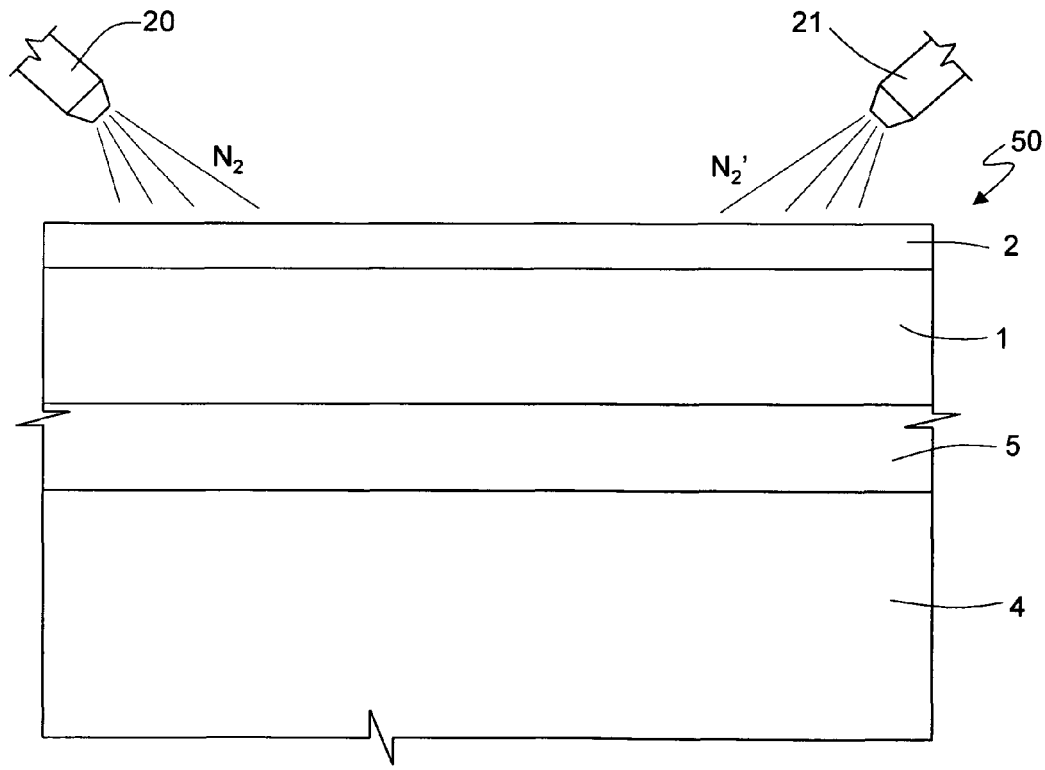

Referring to FIG. 4, then, a second epitaxial layer 2, also of SiC, is homo-epitaxially grown on the first epitaxial layer 1. The second epitaxial layer 2 is a low surface resistivity layer, having, for example of N+ or N++ type, with a higher or equal doping level than the substrate 4 and the buffer layer 5. In particular, the second epitaxial layer 2 has a higher or equal doping level than about $1 \times 10^{18}$ atoms/cm$^3$ and, more particularly, the doping level may be in the range of $2 \times 10^{18}$-$5 \times 10^{19}$ atoms/cm$^3$. In practice, the first epitaxial layer 1 has a first doping level; the second epitaxial layer 2 has a second doping level higher than the first doping level; and the buffer layer 5 has a third doping level higher than the first doping level, but equal to or lower than the second doping level.

The thickness of the epitaxial layer 2 can be well controlled during the process. In fact, in a testing step, in order to set the manufacture parameters, it is sufficient to measure (e.g., using FTIR (Fourier Transform Infra-Red) technique) the total thickness of the layers grown in a time, to determine the growth rate. Once the growth rate and the growth times of the epitaxial layer 2 are known, it is easy to calculate and control the thickness of the above layer during the process.

Still referring to FIG. 4, the buffer layer 5, the first epitaxial layer 1, and the second epitaxial layer 2 are subjected to a flow of dopants, for example of $N_2$ gas, which is generated in three process steps and in different moments of the homo-epitaxial growth. This flow, moreover, is modulated according to the resistivity desired for each layer.

In particular, the doping of the buffer layer 5 is obtained during the growth by generating a flow of dopants of, for example of $N_2$ gas, having a variable value. In particular, initially, a first flowmeter 20 (illustrated only schematically in FIG. 4) is used to generate a constant flow comprised in the range 1-2.5 slm (e.g., in the range 1.5-2 slm), for a duration of time of 1-5 minutes, (e.g., 2-3 minutes). Once this time has elapsed, the flow of $N_2$ is decreased linearly until it is comprised in the range 100-200 sccm, (e.g., 150 sccm). This second step has a duration of 1-3 minutes, (e.g., 1.5-2 minutes).

Next, during the growth of the first epitaxial layer 1, the first flowmeter 20 generates a flow of dopants in an amount comprised in the range 100-200 sccm and for a duration of 10-60 minutes (e.g., 50-55 minutes).

Finally, during the growth of the second epitaxial layer 2, the doping is obtained using, in addition to the first flowmeter 20, a second flowmeter 21 (which is also illustrated schematically in FIG. 4) so as to obtain a high flow of $N_2$. In practice, the first flowmeter 20 generates a first flow having a value equal to the one generated during the growth of the first epitaxial layer 1, and an additional flow $N_2'$ generated by the second flowmeter 21 and having a value comprised in the range 1.5-2 slm, is added to the first $N_2$ flow.

Consequently, as a whole, during the growth of the second epitaxial layer 2, a flow of dopants is generated having a value comprised in the range 1.6-2.2 slm (e.g., in the range 1.8-2 slm) and for a time comprised between 30 seconds and 5 minutes (e.g., between 1 minute and 2 minutes).

After the growth, the second epitaxial layer 2 is thermally oxidized. The duration of this step is modulated, on the basis of the thickness of the second epitaxial layer 2, so as to consume it entirely. Consequently, the second epitaxial layer 2 functions as a sacrificial layer and, on account of its low resistivity, enables a reduction in the formation of trap states during the oxidation step. The oxidation step is performed, according to processes known in the art, either in a wet environment or in a dry environment, rich in $N_2O$ or NO. The oxidation step, moreover, lasts from 60 to 400 minutes, according to the thickness of the epitaxial layer 2 to be oxidized and is performed at a temperature between 1050° C. and 1300° C. (e.g., 1150-1200° C.).

Figure 5:
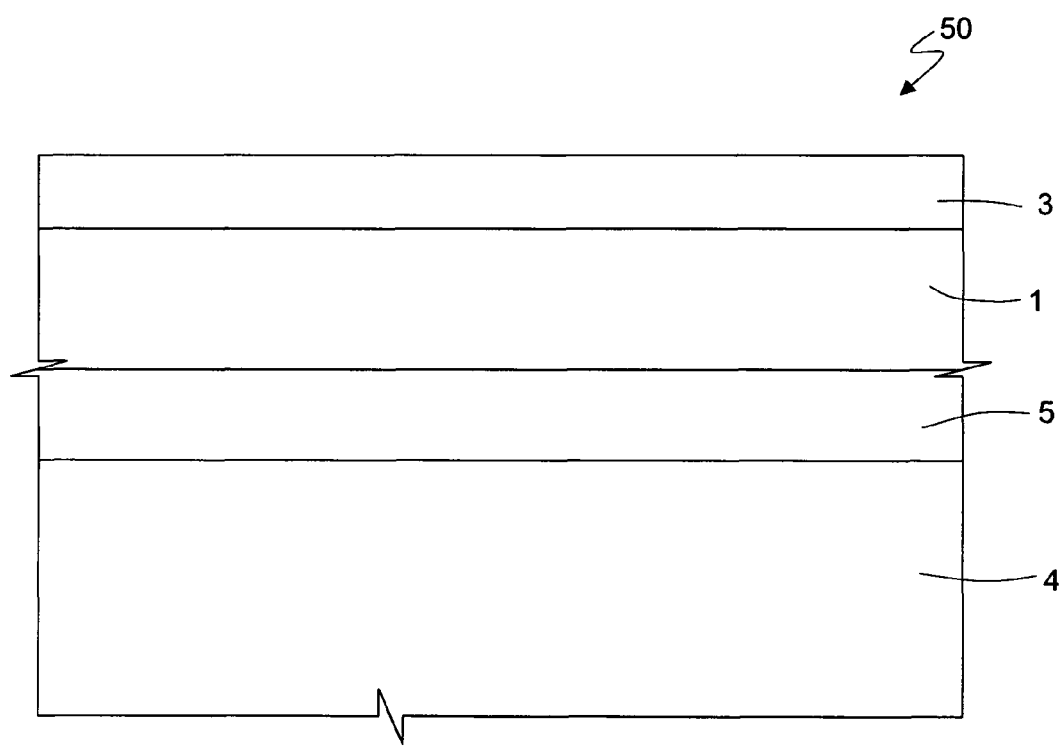

Referring to FIG. 5, at the end of the oxidation step, a silicon oxide layer ($SiO_2$) 3 of high electrical quality is thus formed. As an example, in a test process conducted by the present applicant, a 2"-wafer of SiC with hexagonal symmetry (4 H or 6 H) was used as substrate, with orientation along the Miller axis <0001>, with an offset of 8° with respect to the axis <11-20> and nominal resistivity of 0.02 Ω·cm (~$7 \times 10^{18}$ atoms/cm$^3$). For doping the layers 5, 1 and 2, first a constant flow of 15.5 slm for 5 minutes, then a ramp flow decreasing to 150 sccm for 2 minutes during growth of the buffer layer 5; a flow of 150 sccm for 2 minutes during the growth of the first epitaxial layer 1; and an additional flow of 1.75 slm for 2 minutes during the growth of the second epitaxial layer 2 were generated. In these conditions, the obtained resistivity of the second epitaxial layer 2, having a thickness of 2000 nm, is 0.08 Ω·cm (~$6.5 \times 10^{17}$ atoms/cm$^3$) and a ratio between the carbon atoms and the nitrogen atoms is ~$10^5$/cm$^3$. In this case, it is possible to oxidize all of and only the second surface layer 2, performing an oxidation in a wet environment at 1150° C. for 210 minutes.

Advantages of the process outlined above are described hereinafter. First, it is possible to achieve a low trap density, and hence a low energy-state density, at the interface formed between the second epitaxial layer 2 and the silicon-oxide layer 3. In fact, the agglomerates of carbon atoms and silicon-oxycarbon compounds formed at the SiC/$SiO_2$ interface during the thermal oxidation are reduced. This enables improvement of the electrical performance of the devices.

Furthermore, the formation of a low-resistivity sacrificial layer, namely the epitaxial layer 2, allows the growth of high-quality gate oxides, using gases with low oxidative efficiency, such as N$_2$O, and preventing the use of gas mixtures with higher oxidative efficiency, but that are more dangerous to handle, such as NO.

With the described process it is possible to control the thickness of the low-resistivity sacrificial layer and, thus, to completely eliminate it by oxidation.

Finally, since the manufacture of the low surface-resistivity layers (such as the second epitaxial layer 2) is a single process step of homo-epitaxial growth, the process described is easy to industrialize, simple and economically advantageous.

The above-described processes may be used to form a semiconductor-device structure, such as a plurality of transistors. A gate oxide of each transistor may be comprised of a silicon-dioxide layer, such as the silicon-oxide layer 3 shown in FIG. 5, formed according to any of the processes disclosed herein. The semiconductor-device structure, may be part of an integrated circuit, which may be part of an electronic system, such as a computer system. For example, the integrated circuit may be configured as a memory circuit and may be coupled to a controller to form part of a computer system.

Although the present invention has been disclosed and described by way of some embodiments, it is apparent to those skilled in the art that several modifications to the described embodiments, as well as other embodiments of the present invention are possible without departing from the spirit and scope of the invention.

The invention claimed is:

1. A method for forming an interface between a silicon carbide layer and a silicon oxide layer of a structure designed to conduct current, said method comprising:
   homo-epitaxially growing a first epitaxial layer having a first doping level;
   homo-epitaxially growing, on said first epitaxial layer, a second epitaxial layer having a second doping level higher than said first doping level; and
   oxidizing said second epitaxial layer and forming a silicon oxide layer that comprises a layer interface between the first epitaxial layer and the silicon oxide layer.

2. The method according to claim 1, wherein said second doping level is higher than or equal to 1×10$^{18}$ atoms/cm$^3$ and, for example, comprised in the range 3×10$^{18}$–5×10$^{19}$ atoms/cm$^3$.

3. The method according to claim 1, wherein the step of homo-epitaxial growing a first epitaxial layer comprises generating a first flow of dopants comprised in the range 100-200 sccm.

4. The method according to claim 3, wherein said step of homo-epitaxial growing said second epitaxial layer comprises maintaining the first flow of dopants and adding a second flow of dopants.

5. The method according to claim 4, wherein said second flow of dopants is comprised in the range 1.5-2 slm.

6. The method according to claim 1, wherein the step of homo-epitaxial growing a first epitaxial layer comprises generating a first flow of dopants for 10-60 min, such as for 50-55 min.

7. The method according to claim 1, wherein said step of growing said second epitaxial layer comprises generating a flow of dopants for 30 s-5 min, such as 1-2 min.

8. The method according to claim 1, wherein said step of oxidizing said second epitaxial layer and forming a silicon oxide layer is performed in a wet environment or in a dry environment.

9. The method according to claim 1, wherein said step of oxidizing said second epitaxial layer and forming a silicon oxide layer is performed in an N$_2$O or an NO environment.

10. The method according to claim 1, wherein said step of oxidizing said second epitaxial layer and forming a silicon oxide layer is performed at a temperature of 1050-1300° C., such as, of 1150-1200° C.

11. A method for forming an interface between a silicon carbide layer and a silicon oxide layer of a structure designed to conduct current, said method comprising:
   homo-epitaxially growing a first epitaxial layer having a first doping level;
   homo-epitaxially growing, on said first epitaxial layer, a second epitaxial layer having a second doping level higher than said first doping level; and
   oxidizing said second epitaxial layer and forming a silicon oxide layer;
   wherein said step of homo-epitaxial growing a second epitaxial layer comprises:
   prior to said step of homo-epitaxial growing a first epitaxial layer, providing a substrate of silicon carbide having a third doping level higher than said first doping level;
   homo-epitaxially growing, on said substrate, a buffer layer having said third doping level; and
   introducing, in said second epitaxial layer, a flow of dopants such as to cause said second doping level of said second epitaxial layer to become higher than or equal to said third doping level of said substrate and of said buffer layer.

12. The method according to claim 11, wherein said dopants comprise N$_2$.

13. The method according to claim 11, wherein the step of homo-epitaxial growing a buffer layer comprises generating a first flow of dopants comprised in the range 1-2.5 slm, such as in the range 1.5-2 slm.

14. The method according to claim 11, wherein the step of homo-epitaxial growing a buffer layer comprises generating a flow of dopants for 1-5 min, such as for 2-3 min.

15. The method according to claim 11, wherein the step of homo-epitaxial growing a buffer layer comprises generating a second flow of dopants, subsequent to the first flow of dopants, and decreasing linearly to 100-200 sccm in 1-3 min, such as in 1.5-2 min.

16. A method for forming an interface between a silicon carbide layer and a silicon oxide layer of a structure designed to conduct current, said method comprising:
   homo-epitaxially growing a first epitaxial layer having a first doping level;
   homo-epitaxially growing, on said first epitaxial layer, a second epitaxial layer having a second doping level higher than said first doping level; and
   oxidizing said second epitaxial layer and forming a silicon oxide layer;
   wherein said step of oxidizing said second epitaxial layer and forming a silicon oxide layer comprises modulating the duration of said step of oxidizing so as to entirely consume said second epitaxial layer.

17. The method according to claim 16, wherein said duration of said step of oxidizing is a function of the thickness of said epitaxial layer and is comprised between 60 nm and 400 nm.

18. A method for fabricating a semiconductor structure, comprising:
   epitaxially growing a first silicon-carbide layer having a first doping level;
   epitaxially growing a second silicon-carbide layer on the first silicon-carbide layer, the second silicon-carbide layer having a second doping level different than that of the first doping level; and oxidizing the second silicon-carbide layer to form a silicon dioxide layer that replaces the second silicon-carbide layer.

19. The method of claim 18, wherein epitaxially growing a first silicon-carbide layer having a first doping level comprises doping the first silicon-carbide layer during growth thereof.

20. The method of claim 18, wherein epitaxially growing a second silicon-carbide layer on the first silicon-carbide layer comprises doping the second silicon-carbide layer during growth thereof.

21. The method of claim 18, wherein the second doping level of the second silicon-carbide layer is greater than that of the first doping level of the first silicon-carbide layer.

22. The method of claim 18, wherein epitaxially growing a first silicon-carbide layer having a first doping level comprises epitaxially growing the first silicon-carbide layer on a silicon carbide buffer layer.

23. The method of claim 18, wherein oxidizing the second silicon-carbide layer to form a silicon dioxide layer comprises oxidizing the second silicon-carbide layer in an atmosphere that is substantially free of $NH_3$.

24. The method of claim 23, wherein the atmosphere comprises at least one nitrogen-containing gas selected from the group consisting of $N_2O$ and NO.

25. The method of claim 23, wherein the atmosphere comprises $N_2O$.

26. The method of claim 18, wherein oxidizing the second silicon-carbide layer to form a silicon dioxide layer comprises oxidizing the second silicon-carbide layer at a temperature at or below about 1300° C.

27. A method for fabricating a semiconductor structure, comprising:
  epitaxially growing a first silicon-carbide layer having a first doping level;
  epitaxially growing a second silicon-carbide layer on the first silicon-carbide layer, the second silicon-carbide layer having a second doping level different than that of the first doping level; and
  oxidizing the second silicon-carbide layer to form a silicon dioxide layer;
  wherein epitaxially growing a first silicon-carbide layer having a first doping level comprises epitaxially growing the first silicon-carbide layer on a silicon carbide buffer layer; and
  wherein the silicon carbide buffer layer has a third doping level that is greater than that of the first doping level and less than that of the second doping level.

28. A method for fabricating a semiconductor structure, comprising:
  epitaxially growing a first silicon-carbide layer having a first doping level;
  epitaxially growing a second silicon-carbide layer on the first silicon-carbide layer, the second silicon-carbide layer having a second doping level different than that of the first doping level; and
  oxidizing the second silicon-carbide layer to form a silicon dioxide layer;
  wherein oxidizing the second silicon-carbide layer to form a silicon dioxide layer comprises oxidizing substantially all of and substantially only the second silicon-carbide layer.

29. A method for fabricating a semiconductor structure, comprising:
  epitaxially growing a first silicon-carbide layer having a first doping level;
  epitaxially growing a second silicon-carbide layer on the first silicon-carbide layer, the second silicon-carbide layer having a second doping level different than that of the first doping level; and
  oxidizing the second silicon-carbide layer to form a silicon dioxide layer;
  wherein oxidizing the second silicon-carbide layer to form a silicon dioxide layer comprises oxidizing the second silicon-carbide layer to form an interface between the silicon dioxide layer and the first silicon-carbide layer.

* * * * *